(12) United States Patent
Dusa et al.

(10) Patent No.: US 7,704,850 B2
(45) Date of Patent: Apr. 27, 2010

(54) SEMICONDUCTOR DEVICE FOR MEASURING AN OVERLAY ERROR, METHOD FOR MEASURING AN OVERLAY ERROR, LITHOGRAPHIC APPARATUS AND DEVICE MANUFACTURING METHOD

(75) Inventors: Mircea Dusa, Campbell, CA (US); Axel Nackaerts, Haasrode (BE); Gustaaf Verhaegen, Putte (BE)

(73) Assignee: ASML Netherlands B.V., Veldhoven (NL)

( * ) Notice: Subject to any disclaimer, the term of this patent is extended or adjusted under 35 U.S.C. 154(b) by 621 days.

(21) Appl. No.: 11/517,571

(22) Filed: Sep. 8, 2006

(65) Prior Publication Data
US 2008/0061291 A1 Mar. 13, 2008

(51) Int. Cl.
*H01L 27/088* (2006.01)
(52) U.S. Cl. .................. 438/401; 257/E29.136
(58) Field of Classification Search ............... 257/48, 257/401
See application file for complete search history.

(56) References Cited

U.S. PATENT DOCUMENTS

| 6,144,081 | A | 11/2000 | Hsu et al. |
| 6,747,310 | B2 | 6/2004 | Fan et al. |
| 2005/0127441 | A1* | 6/2005 | Plass et al. .................. 257/347 |
| 2006/0167653 | A1* | 7/2006 | Asano ........................ 702/179 |

* cited by examiner

*Primary Examiner*—Thao X Le
*Assistant Examiner*—Kimberly Trice
(74) *Attorney, Agent, or Firm*—Pillsbury Winthrop Shaw Pittman LLP

(57) ABSTRACT

A semiconductor device for determining an overlay error on a semiconductor substrate includes a first and a second transistor. Each transistor includes two diffusion regions associated with a gate, the diffusion regions of each transistor being arranged in a first direction. The second transistor is arranged adjacent to the first transistor in a second direction perpendicular to the first direction. The first and second gate each have a non-uniform shape, and the second gate is oriented with respect to an orientation of the first gate in such a way that an effect of an overlay error on a device parameter of the second transistor has an opposite sign in comparison to an effect of the overlay error on a corresponding device parameter of the first transistor.

18 Claims, 5 Drawing Sheets

SEMICONDUCTOR DEVICE FOR MEASURING AN OVERLAY ERROR, METHOD FOR MEASURING AN OVERLAY ERROR, LITHOGRAPHIC APPARATUS AND DEVICE MANUFACTURING METHOD

BACKGROUND OF THE INVENTION

1. Field of the Invention

The present invention relates to a semiconductor device for measuring an overlay error, a method for measuring an overlay error, a lithographic apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

An integrated circuit is formed of a plurality of individual layers which are each patterned according to its specific pattern as explained above. Each patterned layer must have a certain alignment or overlay with the previous patterned layer(s) on which the layer is located to ensure that an integrated circuit according to the design can be formed. For this reason, lithographic processing requires that all patterns are aligned with respect to each other. A measure for the accuracy of the alignment is the overlay between successive patterns, i.e., one pattern superimposed on a preceding created pattern. The mismatch in overlay is commonly referred to as an overlay error.

Overlay can be measured optically by overlay markers which comprise one part that is created in a first layer during a first patterning and another part that is created in a successive layer during a subsequent patterning. The relative position of the two parts is used as a measure for the overlay. This procedure can be repeated as many times as required during the production stage of the integrated circuit.

Also, overlay can be measured after completion of the production stage of the integrated circuit by electrical measurements which basically correlate yield to overlay. Such electrical measurements typically provide simple Boolean results, i.e., a short exists between two layers or not. Typically, the prior art applies electrical measurements on arrays of structures with various known displacements that create shorts or opens when a specific overlay error is reached. All structures are measured and the breaking point between working/not working determines the overlay. The overlay error cannot be determined with a precision smaller than the built-in displacement. The drawback of this way of working is that fine-grained measurement requires a large amount of structures and measurements.

SUMMARY OF THE INVENTION

It is desirable to have a method for manufacturing a device which comprises determination of overlay by electrical measurement with a relatively high precision in comparison to the method from the prior art.

In one embodiment, a semiconductor device for determining an overlay error on a semiconductor substrate comprises a first transistor and a second transistor; the first transistor comprising a first and a second diffusion region associated with a first gate; the second transistor comprising a third and a fourth diffusion region associated with a second gate; the first and second gate each having a non-uniform shape, and the second gate being oriented with respect to an orientation of the first gate in such a way that an effect of an overlay error on a device parameter of the second transistor has an opposite sign in comparison to an effect of the overlay error on the device parameter of the first transistor.

The present invention allows measurement of the overlay error on a continuous scale, in contrast to the prior art method which as discussed above only allows determination of discrete values of the overlay error.

In a second embodiment, a method of fabrication of semiconductor device for determining an overlay error on a semiconductor substrate comprises providing on the semiconductor substrate a first transistor and a second transistor; providing the first transistor with a first and a second diffusion region associated with a first gate; providing the second transistor with a third and a fourth diffusion region associated with a second gate; forming a first and a second semiconductor surface region of the semiconductor substrate for forming the first and second transistor respectively; creating the first gate on the first semiconductor surface region and the second gate on the second semiconductor surface region; the first and second gate each having a non-uniform shape, and the second gate being oriented with respect to an orientation of the first gate in such a way that an effect of an overlay error on a device parameter of the second transistor has an opposite sign in comparison to an effect of the overlay error on the device parameter of the first transistor.

In a third embodiment, a method for measuring an overlay error of a lithographic pattern on semiconductor substrate, the lithographic pattern comprising at least one semiconductor device which comprises a first transistor and a second transistor; the first transistor comprising a first and a second diffusion region associated with a first gate; the second transistor comprising a third and a fourth diffusion region associated with a second gate; the first and second gate each having a non-uniform shape, and the second gate being oriented with respect to an orientation of the first gate in such a way that an effect of an overlay error on a device parameter of the second transistor has an opposite sign in comparison to an effect of the overlay error on the device parameter of the first transistor; the method comprises determining a first value of a device parameter of the first transistor of the at least one semiconductor device; determining a second value of the device parameter of the second transistor of the at least one semiconductor device; and determining a device parameter difference between the first value of the device parameter of the first transistor and the second value of the device parameter of the second transistor.

In a fourth embodiment, a lithographic apparatus comprises an illumination system configured to condition a radiation beam; a support configured to support a patterning device, the patterning device being configured to impart the radiation beam with a pattern in its cross-section to form a patterned radiation beam; a substrate table configured to hold a substrate; an interferometric device configured to determine a position of the substrate table and a projection system configured to project the patterned radiation beam onto a target portion of the substrate; an input port; a processor; a memory; and an output port, the processor being connected to the input port, to the memory, and to the output port, the processor being arranged for electrically connecting through the input port to at least one semiconductor device, the at least one semiconductor device arranged for determining an overlay error on a semiconductor substrate comprising a first transistor and a second transistor, the first transistor comprising a first and a second diffusion region associated with a first gate, the second transistor comprising a third and a fourth diffusion region associated with a second gate, the first and second gate each having a non-uniform shape, and the second gate being oriented with respect to an orientation of the first gate in such a way that an effect of an overlay error on a device parameter of the second transistor has an opposite sign in comparison to an effect of the overlay error on the device parameter of the first transistor, the processor being configured to receive a first signal comprising a first value of the device parameter of the first transistor of at least one semiconductor device; receive a second signal comprising a second value of the device parameter of the second transistor of the at least one semiconductor device; determine a device parameter difference between the first value of the device parameter of the first transistor and the second value of the device parameter of the second transistor of the at least one semiconductor device; and determine from the device parameter difference an overlay error value.

In a fifth embodiment, a computer program to be loaded by a computer, the computer comprising a processor, memory, an input port and an output port, the memory being connected to the processor, and the input port and the output port each being connected to the processor, the computer being part of a lithographic apparatus, the lithographic apparatus comprising an illumination system configured to condition a radiation beam; a support configured to support a patterning device, the patterning device being configured to impart the radiation beam with a pattern in its cross-section to form a patterned radiation beam; a substrate table configured to hold a substrate; an interferometric device for determining a position of the substrate table and a projection system configured to project the patterned radiation beam onto a target portion of the substrate; the processor being configured to connect through the input port to at least one semiconductor device; the at least one semiconductor device for determining an overlay error on a semiconductor substrate comprising a first transistor and a second transistor; the first transistor comprising a first and a second diffusion region associated with a first gate; the second transistor comprising a third and a fourth diffusion region associated with a second gate; the first and second gate each having a non-uniform shape, and the second gate being oriented with respect to an orientation of the first gate in such a way that an effect of an overlay error on a device parameter of the second transistor has an opposite sign in comparison to an effect of the overlay error on the device parameter of the first transistor; the computer program product after being loaded being configured to cause the processor to receive a first signal comprising a first value of a device parameter of the first transistor of at least one semiconductor device; receive a second signal comprising a second value of the device parameter of the second transistor of the at least one semiconductor device; and determine a device parameter difference between the first value of the device parameter of the first transistor and the second value of the device parameter of the second transistor of the at least one semiconductor device.

In a sixth embodiment, a device manufacturing method comprises transferring a lithographic pattern from a patterning device onto a substrate; measuring an overlay error of the lithographic pattern on semiconductor substrate, the lithographic pattern comprising a portion of at least one semiconductor device which comprises a first transistor and a second transistor, the first transistor comprising a first and a second diffusion region associated with a first gate, the second transistor comprising a third and a fourth diffusion region associated with a second gate, the first and second gate each having a non-uniform shape, and the second gate being oriented with respect to an orientation of the first gate in such a way that an effect of an overlay error on a device parameter of the second transistor has an opposite sign in comparison to an effect of the overlay error on the device parameter of the first transistor; determining a device parameter of the first transistor of the at least one semiconductor device; determining a device parameter of the second transistor of the at least one semiconductor device; and determining a device parameter difference between the first value of the device parameter of the first transistor and the second value of the device parameter of the second transistor of the at least one semiconductor device.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
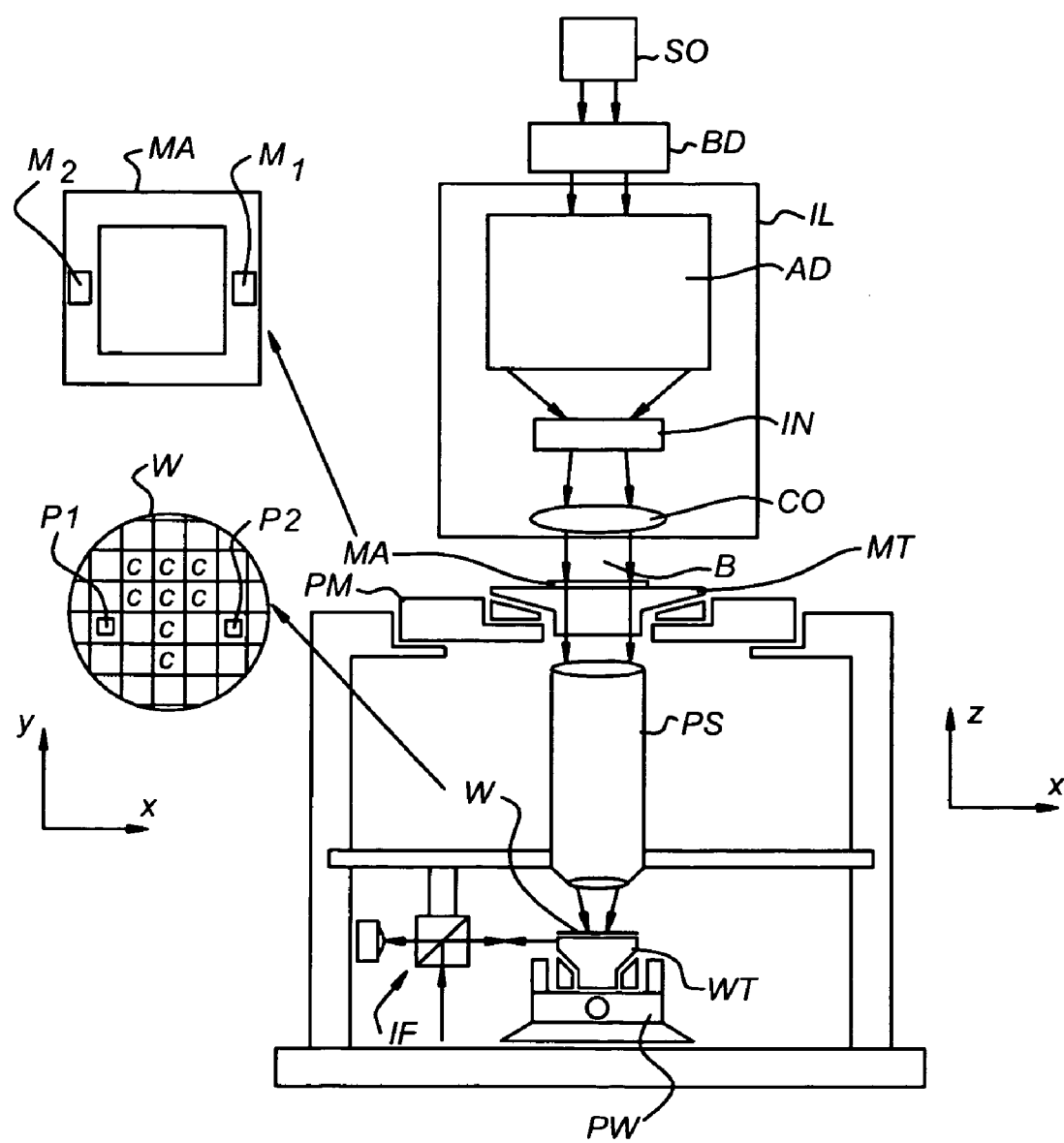
FIG. 1 depicts a lithographic apparatus according to an embodiment of the invention.

FIG. 1 schematically depicts a lithographic apparatus according to one embodiment of the invention. The apparatus comprises an illumination system (illuminator) IL configured to condition a radiation beam B (e.g. UV radiation or EUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
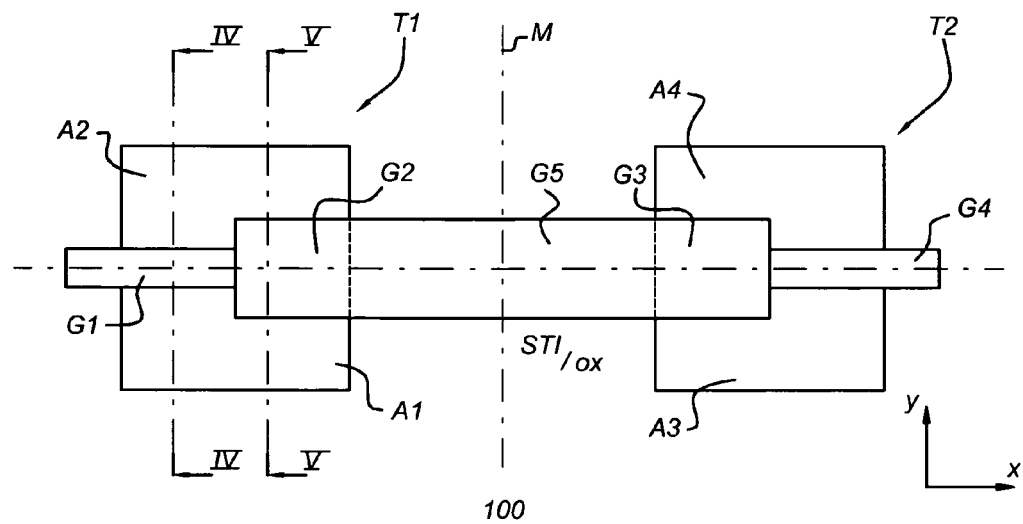
FIG. 2 depicts a top view of a semiconductor device for measuring overlay according to an embodiment of the invention.

FIG. 2 depicts a top view of a semiconductor device for measuring overlay in accordance with a first embodiment of the present invention.

On a semiconductor substrate 100, a semiconductor device 1 for measuring overlay comprises two field effect transistors T1 and T2. First field effect transistor T1 extends in a direction Y and comprises a first diffusion region A1, a second diffusion region A2 and a first channel region R1 (FIG. 4) located in between the first and second diffusion regions A1, A2. Above the first channel region R1 a non-uniform gate G1, G2 is located, which comprises a first gate portion G1 and a second gate portion G2. The first gate portion G1 and the second gate portion G2 extend parallel to each other between the first diffusion region A1 and the second diffusion region A2.

The gate G1, G2 is non-uniform in that the gate length (in direction Y) of the first gate portion G1 differs from that of the second gate portion G2. The first gate portion G1 of the non-uniform gate on the channel region R1 has a length L1, i.e., in the direction from the first diffusion region A1 to the second diffusion region A2. The second gate portion G2 has a length L2. The length L1 of the first gate portion G1 is smaller in comparison to the length L2 of the second gate portion G2.

The second field effect transistor T2 is adjacent to the first field effect transistor T1 in a second direction X, perpendicular to direction Y. The first and second transistors are separated from each other in direction X by an isolation region, e.g., a shallow trench isolation STI.

The second field effect transistor T2 has a substantially similar layout as the first field effect transistor T1. The layout of the second transistor T2 is a mirror image of the first field effect transistor T1 with respect to a mirror line M, which extends in direction Y.

The second transistor T2 extends in direction Y and comprises a third diffusion region A3, a fourth diffusion region A4 and a second channel region R2 (not shown) located in between the third and fourth diffusion regions A3, A4. Above the second channel region R2 a second non-uniform gate G3, G4 is located, which comprises a third gate portion G3 and a fourth gate portion G4.

The third gate portion G3 of the second field effect transistor T2 is connected to the second gate portion G2 of the adjacent first field effect transistor T1 by connecting line G5 perpendicular to the mirror line M. The third gate portion G3 of the second non-uniform gate has a third gate length L3, substantially equal to the second gate length L2 of the second gate portion G2. The fourth gate portion G4 has a fourth gate length L4. The fourth gate length L4 of the fourth gate portion G4 is smaller in comparison to the third gate length L3 of the third gate portion G3. Due to the symmetrical design of the first and second transistors T1, T2 as mirrored in mirror line M, the fourth gate length L4 of the fourth gate portion G4 of the second transistor T2 is substantially identical to the first gate length L1 of the first gate portion G1 of the first transistor T1.

The size W (in direction X) of the diffusion regions A1, A2, A3, A4 and the channel regions R1, R2 is substantially identical.

Each transistor T1, T2 comprises a first diffusion contact C1, C3 to one of its diffusion regions A1, A3, a second diffusion contact C2, C4 to the other of its diffusion regions A2, A4 and a gate contact G to its non-uniform gate G1, G2; G3, G4.

The first and second field effect transistors are designed as parallel structures with the second non-uniform gate being oriented with respect to an orientation of the first non-uniform gate in such a way that an effect of an overlay error on a device parameter of the second transistor has an opposite sign in comparison to an effect of the overlay error on the device parameter of the first transistor.

The second field transistor T2 is substantially identical to the first field effect transistor T1, and the first and second field effect transistors are designed in a substantially symmetrical mirrored layout. Accordingly, a first amplitude of the effect of an overlay error in the first transistor will be substantially equal to a second amplitude of the effect of an overlay error in the second transistor, but the effect on the first transistor will have a sign opposite to the sign of the effect on the second transistor.

In a further embodiment, instead of applying the connecting line G5 on the gate level, the connecting line may also be embodied as an interconnect line at, for example, a metal-1 level.

The semiconductor device as described above can be manufactured using standard lithographic procedures, for example using CMOS technology.

Figure 4:
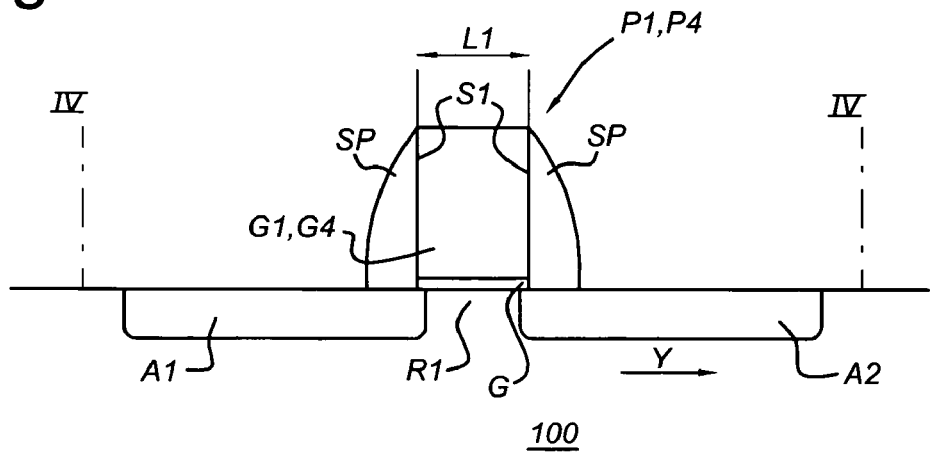
FIG. 4 depicts a cross-section of a first region of the semiconductor device for measuring overlay.
Figure 5:
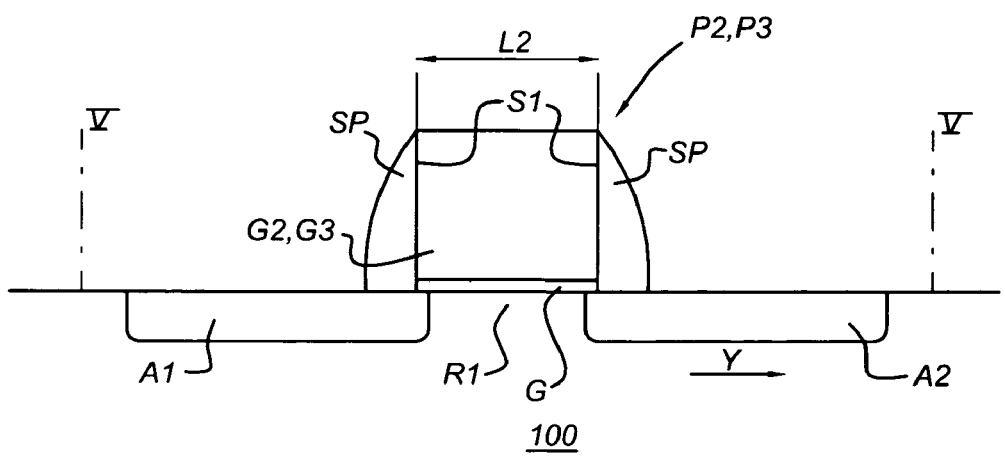
FIG. 5 depicts a cross-section of a second region of the semiconductor device for measuring overlay.

Manufacturing the semiconductor device may comprise a series of processes. Referring to FIGS. 2, 4 and 5, on the semiconductor substrate shallow trench isolation regions STI are defined by a sequence of lithography, etching, deposition of insulator (e.g., silicon dioxide) and chemical mechanical polishing (CMP). The shallow trench isolations STI demarcate the semiconductor surface regions where the first and second transistors T1, T2 are to be created. If required, in a following process, well implantations are created. Next, the gate dielectric G is deposited on the semiconductor surface of the substrate followed by the deposition of the gate material.

Then, the non-uniform gates G1, G2; G3, G4 of the first and second transistors T1, T2 and the connecting line G5 between the two gates are defined by lithography and etching. Possibly, additional implantations are done (using the gate(s) as mask). In a following process, spacers SP are created. Then, the source/drain regions A1, A2, A3, A4 are implanted to obtain a heavily doped drain (HDD) profile. After that, source/drain regions and gates may be silicided. In a next process, contacts to the source drain areas and to the non-uniform gates are formed by deposition of contact stack, lithography of the stack, contact hole etching, contact hole filling (with e.g. tungsten) and planarisation (CMP).

According to the present invention, the definition of the gates comprises the creation of the non-uniform gates G1, G2; G3, G4. It is noted that the manufacturing process of the semiconductor device according to the present invention as described above is only illustrative. It should be appreciated that alternative implementations may be used.

Figure 3:
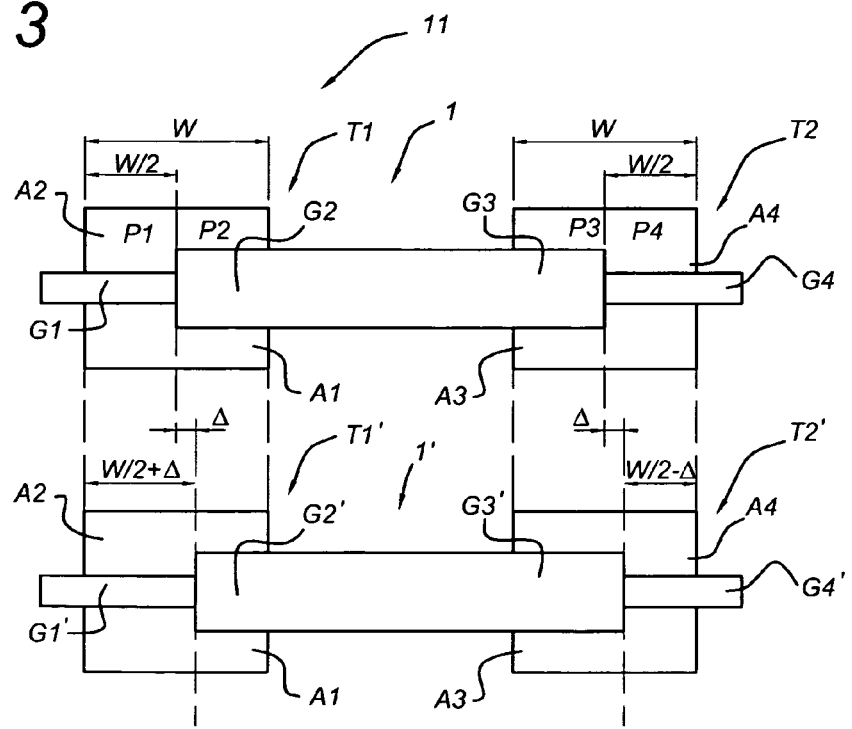
FIG. 3 illustrates a principle of the semiconductor device for measuring overlay.

Referring to FIGS. 4 and 5, the construction of the first and second transistors T1, T2 will be explained in more detail. FIG. 3 illustrates a principle of the semiconductor device for measuring overlay according to the first embodiment. In FIG. 3 two semiconductor devices 1, 1' in accordance with the first embodiment are shown.

The principle of measuring overlay by the semiconductor device 1, 1' is based on a measurement technique for matching a pair of transistors. Devices such as field effect transistors T1, T2 that are substantially the same, have substantially the same performance when these field effect transistors T1, T2 are spaced relatively close together on the semiconductor substrate. In this context, performance of the field effect transistor(s) may relate to a device parameter such as an on-current, an off-current or a threshold voltage of the transistor.

The "matching" measurement technique for measuring one or more performance parameters of basic field effect transistors (i.e. each transistor has a single gate) is known in the art. The measurements on such basic field effect transistors yield results with a distribution of the measured parameter values. Such a distribution typically is centered around a zero difference value of a pair of matching field effect transistors.

In the present invention, the distribution of matching transistor pairs T1, T2 is only centered, if during fabrication no overlay error occurs in the direction of the width of the gate (that is, along direction X), due to the fact that each field effect transistor now has a non-uniform gate along that direction X.

The non-uniform gate effectively divides each field effect transistor T1, T2 in a first transistor portion P1, P4 for the one gate portion G1, G4 and a second transistor portion P2, P3 for the other gate portion G2, G3.

Thus, a device parameter Z measured on, for example, the first field effect transistor T1 comprises a first device parameter component ZP1 relating to the first transistor portion P1 and a second device parameter component ZP2 relating to the second transistor portion P2.

Taking into account the width of each of the transistor portions P1, P2:

$$Z = ZP1*W1 + ZP2*W2 \quad (1),$$

wherein W1 equals the width of the first transistor portion P1 and W2 equals the width of the second transistor portion. (Note that ZP1 is not equal to ZP2 since the channel length L1 of the first transistor portion P1 is not equal to that (L2) of the second transistor portion P2.)

In the upper part of FIG. 3, a situation is shown in which no overlay error occurs. In this case, the width of the first gate portion is equal to the width of the second gate portion, i.e., the width of the channel region divided by two: W/2 (i.e., W1=W2=W/2). Since the second field effect transistor T2 is identical to the first field effect transistor T1, although mirrored in line M, the device parameter Z for the second transistor T2 will be substantially the same as for the first transistor T1.

By the matching measurement a difference between a device parameter (e.g., on-current, off-current, or threshold voltage) measured on the first transistor T1 and the same device parameter on the second transistor T2 can be determined.

It is noted that the division of the width W of the channel region of each transistor T1; T2 in two substantially equally sized portions as described above is only an example, another division of the transistor T1; T2 may also be applied provided that the same division is applied to the second mirrored transistor.

Under the assumption that the transistors T1, T2 are substantially identical (i.e. the non-uniform gate of the first transistor is exactly mirrored with respect to the non-uniform gate of the second transistor without an overlay error), the difference of the measured device parameter is (ideally) zero.

In the lower part of FIG. 3, a semiconductor device 1' is shown in which an overlay error $\Delta$ occurs which extends along the direction X, i.e., along the width of the channel region. On both the first transistor T1' and the second transistor T2' the non-uniform gate is shifted over a distance $\Delta$ along direction X due to the overlay error.

Due to the overlay error $\Delta$ of the gate in comparison to the channel region, the first transistor T1' displays a first gate portion G1' with a width W/2+$\Delta$ and second gate portion G2' with a width W/2-$\Delta$ and the second transistor T2' displays a third gate portion G3' with a width W/2+$\Delta$ and a fourth gate portion G4' with a width W/2-$\Delta$.

Except for the different overlay of the gate portions G1', G2'; G3', G4', the transistors T1', T2' are assumed to be further substantially identical. (In this respect, entities with the same reference number in semiconductor device 1' refer to similar entities of semiconductor device 1.) By consequence, the device parameter Z1 measured of the first transistor T1' may be equal to (in analogy to equation (1)):

$$Z1 = ZP1*(W/2+\Delta) + ZP2*(W/2-\Delta) \quad (2),$$

at least for $\Delta \ll W$, and the device parameter Z2 measured of the first transistor T2' may be equal to $$Z2 = ZP1*(W/2-\Delta) + ZP2*(W/2+\Delta) \quad (3),$$

at least for $\Delta \ll W$, and $$Z1 - Z2 = (ZP1 - ZP2)*2\Delta \quad (4).$$

Since ZP1 is not equal to ZP2, the difference between Z1 and Z2 is not equal to zero but proportional to the overlay error $\Delta$.

The semiconductor device 1 according to the invention allows measurement of the overlay error $\Delta$ on a continuous scale, in contrast to the prior art method as discussed above which only allows determination of discrete values of the overlay error $\Delta$.

By providing an array of several semiconductor devices 1, each with specific and known designed-in overlay error $\in$, a linear regression method can be used to determine the actual overlay error $\Delta$. The difference of the device parameter (i.e., Z1−Z2) as a function of the specific designed-in overlay error $\in$ (plus the unknown actual overlay error $\Delta$) is measured. The results on the difference are plotted as a function of the designed-in overlay error ∈ that will yield a substantially linear curve (in accordance with the equations presented above). Then, linear regression coefficients of this curve are determined. From the determined linear regression coefficients the actual overlay error Δ can be calculated from an intersection of the curve with the overlay error ∈ axis at which the measured device parameter difference is zero.

For a given device generation or node the sensitivity of the linear regression method can be adjusted by adapting the series of values of the designed-in overlay error ∈ to that particular device generation or node, since the magnitude of the possible overlay error may be different depending on a critical dimension (i.e., the smallest size of features of a semiconductor device) of that device generation. For example, the 3σ error of the overlay error Δ in devices of the 130 nm node is about 20 nm, whereas 3σ of the overlay error Δ for the 65 nm node is about 8-10 nm.

The relevant dimensions of the semiconductor device may be the following: width W of the diffusion region and channel regions=500 nm, the first (4th) gate length L1 (L4)=150 nm and the second (third) gate length L2 (L3)=250 nm.

The designed-in overlay error ∈ values may be a series in the range from 5-30 nm, with an increment of 5 nm.

It should be appreciated that the semiconductor device 1 can be aligned in various directions for measurement of overlay in that specific direction. For example, the semiconductor device may be aligned with the control gate line comprising the first gate portion G1, the second gate portion G2, the third gate portion G3 and the fourth gate portion G4 that are arranged either along or perpendicular to the scanning direction of the lithographic apparatus (i.e., along the scanning direction and the non-scanning direction, respectively).

In addition, since the semiconductor device 1 of the present invention can be produced by a standard CMOS processing sequence, the semiconductor device 1 (or an array of semiconductor devices 1) can easily be used as an embedded structure in a large device structure.

Moreover, the (array of) semiconductor devices 1 according to the present invention can also be used as a correcting electronic device comprised in a microelectronic device. During operation, the microelectronic device may allow measurement of the semiconductor device(s) 1 by, for example, an evaluating circuit and may be capable of determining from the measured results the overlay error incurred during fabrication of the microelectronic device. This may be useful as an internal correction for a microelectronic device that comprises one or more functional blocks that are sensitive to overlay error.

In the embodiment described above, the non-uniform shape of the first gate of the first transistor is identical to the shape of the second gate of the second transistor, although mirrored. It is noted that according to the invention the non-uniform shape of the first gate of the first transistor may be different from the non-uniform shape of the second gate of the second transistor. It should be appreciated that the amplitude of the effect of an overlay error on a transistor may relate to the shape of the gate of that transistor. By measuring an effect of an overlay error on a device parameter of the second transistor which differs from the effect of the overlay error on the device parameter of the first transistor due to a shape difference of the first and second gates, the overlay error may still be determinable. It should be appreciated that this may require a calibration procedure and/or additional mathematical solutions.

FIG. 4 depicts a cross-section of a first region of the semiconductor device for measuring overlay along line IV-IV of FIG. 2.

In a surface of the semiconductor substrate 100, first and second diffusion regions A1, A2 are arranged with the first channel region R1 located in between A1, A2. A thin dielectric layer or gate oxide G covers the channel region R1.

On top of the gate oxide G, the first gate portion G1 is arranged. Spacers SP cover sidewalls S1. The first gate portion G1 has a length L1 in direction Y.

FIG. 5 depicts a cross-section of a second region of the semiconductor device for measuring overlay along line V-V of FIG. 2. In the surface of the semiconductor substrate 100, first and second diffusion regions A1, A2 are arranged with the first channel region R1 located in between A1, A2. A thin dielectric layer or gate oxide G covers the channel region R1.

On top of the gate oxide G, the second gate portion G2 is arranged. Sidewalls S1 are covered by spacers SP. The first gate portion G2 has a length L2 in direction Y.

The overlay error Δ incurred by lithographic processing on a particular microelectronic device equipped with the semiconductor device 1 can be determined by measurement of the device parameter of the semiconductor device 1 after the semiconductor device has reached the state where it is electrically measurable. The results of the measurement can be used to provide a correction factor to the lithographic apparatus that was used in manufacturing the particular microelectronic device.

Figure 6:
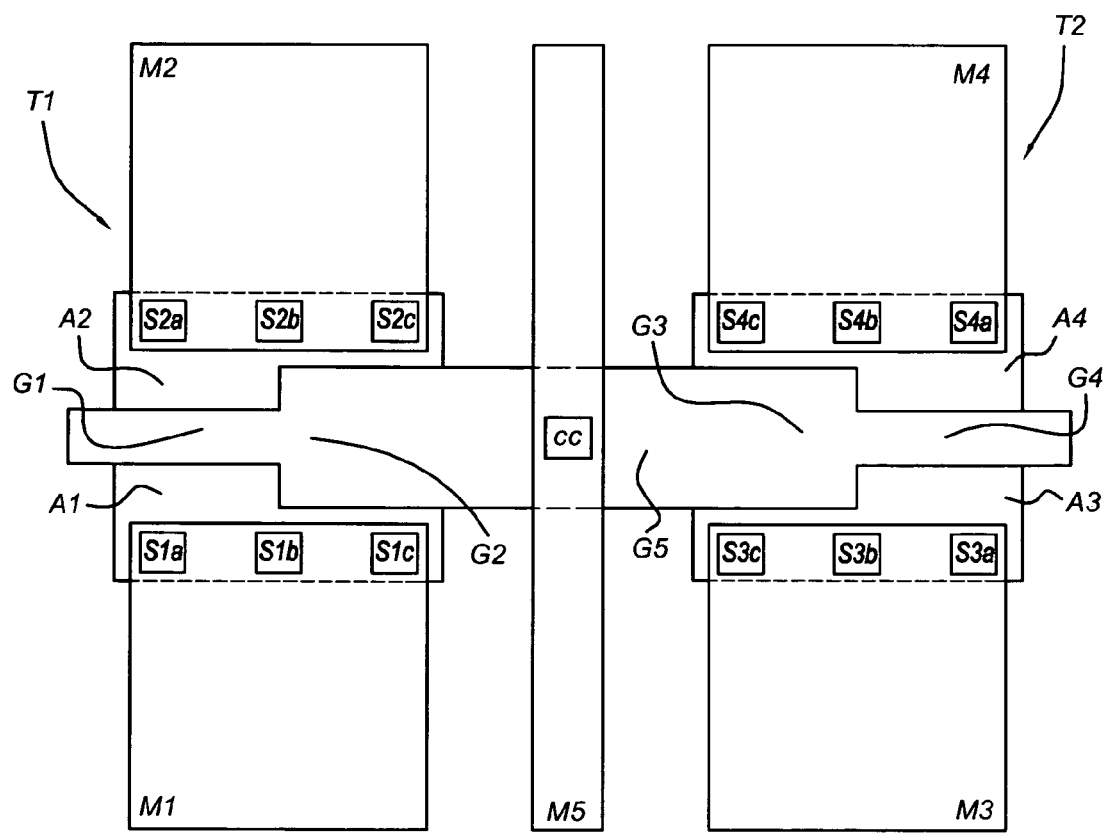
FIG. 6 depicts a layout of the semiconductor device as shown in FIG. 2.

FIG. 6 shows a plan-view of a further layout of the semiconductor device as shown in the preceding figures. In FIG. 6 entities with the same reference number refer to the same entities as shown in the preceding figures. The first and second transistors T1, T2 have contacts to metallization. Metallization is typically located in a level above the transistor which is formed in the surface of the semiconductor substrate 100. Between the metallization level and the transistor is at least one insulating layer, which electrically separates the metallization and the transistor. The first transistor T1 comprises a plurality of first and second contacts S1a, S1b, S1c; S2a, S2b, S2c which connect the first diffusion region A1 to a first metal line M1, and the second diffusion region A2 to a second metal line M2, respectively.

Similarly, the second transistor T2 comprises a plurality of third and fourth contacts S3a, S3b, S3c; S4a, S4b, S4c which connect the third diffusion region A3 to a third metal line M3, and the fourth diffusion region A4 to a fourth metal line M4, respectively.

The plurality of contacts on each diffusion region is configured in such a way that their position substantially does not affect a measurement of the device parameter of the transistor corresponding to the respective diffusion region. In FIG. 6 three square contacts per diffusion region are shown, but it should be appreciated that a different number of contacts on a diffusion region (i.e., at least one) may be used. Also, it will be appreciated that the shape of the one or more contacts on a diffusion region may be different than shown here, e.g., rectangular. In the embodiment of the semiconductor device 1 as shown in FIG. 2, the connecting line G5 between the non-uniform gates G1, G2; G3, G4 of the first and second transistors T1, T2 is connected by a common contact CC to a fifth metal line M5.

The first, second, third, fourth and fifth metal lines M1, M2, M3, M4, M5 are arranged on the semiconductor substrate as to provide connections to circuitry (not shown) for measuring a device parameter of the first transistor T1 and the second transistor T2, respectively.

Figure 7:
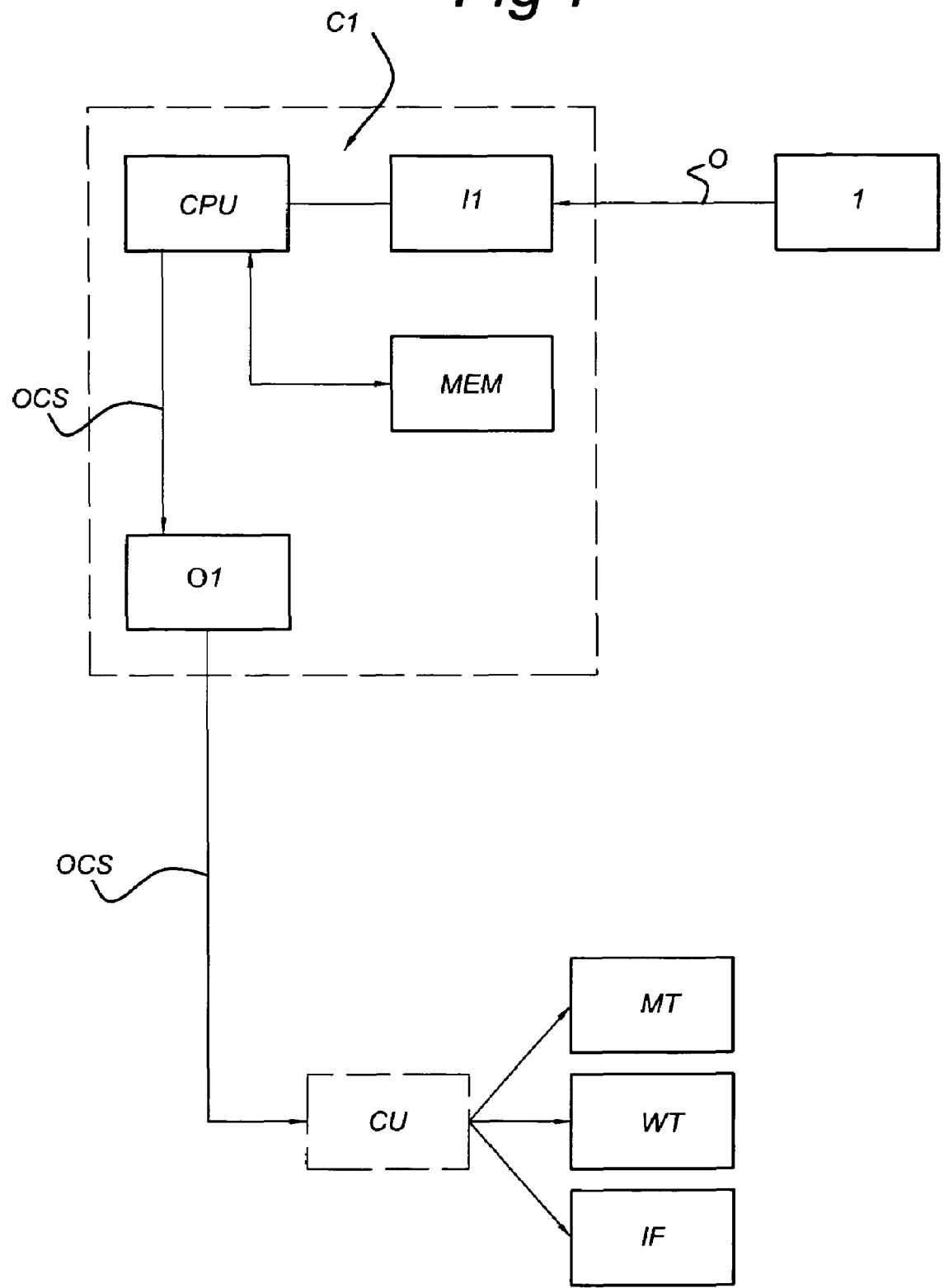
FIG. 7 depicts a circuit of a lithographic apparatus.

FIG. 7 shows a circuit of a lithographic apparatus in accordance with the present invention. In one embodiment of the invention a lithographic apparatus is provided with a circuit C1 that comprises an input port I1, a processor CPU and memory MEM. The input I1 is arranged to receive an overlay error signal O that relates to the overlay error Δ as can be measured, or determined in any way as described above, by the semiconductor device 1 or by an array of such semiconductor devices 1. The processor CPU is connected to the input port I1 for receiving the overlay error signal O. Also, the processor CPU is connected to memory MEM and to an output port O1. Output port O1 is connected to the mask table MT, the wafer stage WT and the interferometric device IF (or to at least one control unit CU (shown in phantom) for controlling the mask table MT, the wafer stage WT and the interferometric device IF, respectively). The processor CPU is further arranged to determine from the received overlay error signal O the overlay error Δ and to provide an overlay error correction signal OCS to at least one of the mask table MT, the wafer stage WT and the interferometric device IF (or the at least one control unit CU of the mask table MT, the wafer stage WT and the interferometric device(s) IF).

By providing the overlay error correction signal OCS to at least one of the mask table MT, the wafer stage WT and the interferometric device(s) IF the lithographic apparatus is capable of correcting, for example, a change or drift of its settings that may occur during production. The processor CPU is shown as one box, however, it may comprise several processing units functioning in parallel or controlled by one main processor, that may be located remotely from one another, as should be appreciated.

The functionality of the processor CPU can be embodied either in hardware or software components to carry out the function as described above. It should be appreciated that the functionality of the invention may also be accomplished by a combination of hardware and software components. As should be appreciated, hardware components, either analog or digital, may be present within the processor CPU or may be present as separate circuits which are interfaced with the processor CPU. Further it should be appreciated that software components may be present in the memory region MEM connected to the processor CPU. The memory MEM may also be integrated with the processor CPU as an internal memory.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it should be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248. 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it should be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A semiconductor device, for determining an overlay error on a semiconductor substrate, the semiconductor device comprising a first transistor and a second transistor, wherein the first transistor comprises a first and a second diffusion region associated with a first gate, the first gate comprising a first gate portion and a second gate portion, the first gate portion and the second gate portion extending parallel to each other in a first direction, a gate length of the first gate portion being different from a gate length of the second gate portion; the second transistor comprises a third and a fourth diffusion region associated with a second gate, the second gate comprising a third gate portion and a fourth gate portion, the third gate portion and the fourth gate portion extending parallel to each other in the first direction, a gate length of the third gate portion is different from a gate length of the fourth gate portion; the second transistor arranged adjacent to the first transistor in a second direction perpendicular to the first direction; the first and second gates each having a non-uniform shape, and wherein the second gate is oriented with respect to an orientation of the first gate such that an effect of an overlay error on a device parameter of the second transistor has an opposite sign in comparison to an effect of the overlay error on a corresponding device parameter of the first transistor.

2. A semiconductor device according to claim 1, wherein the arrangement of the third gate portion and the fourth gate portion of the second gate is in a mirrored layout with respect to the arrangement of the first gate portion and the second gate portion of the first gate.

3. A semiconductor device according to claim 1, further comprising a circuit configured to determine a first value of the device parameter of the first transistor and a second value of the device parameter of the second transistor.

4. A semiconductor device according to claim 3, wherein the circuit is configured to determine a device parameter difference between the first value of the device parameter of the first transistor and the second value of the device parameter of the second transistor.

5. A semiconductor device according to claim 3, wherein the device parameter is from a group comprising on-current, off-current and threshold voltage.

6. A semiconductor device according to claim 1, wherein the first gate of the first transistor and the second gate of the second transistor are connected and share a common gate contact.

7. A method of fabrication of semiconductor device for determining an overlay error on a semiconductor substrate, the method comprising:
provide on the semiconductor substrate a first transistor and a second transistor, the second transistor arranged adjacent to the first transistor in a first direction;
providing the first transistor with a first and a second diffusion region associated with a first gate, the first gate comprises a first gate portion and a second gate portion, the first gate portion and the second gate portion extending parallel to each other in a second direction perpendicular to the first direction, a gate length of the first gate portion being different from a gate length of the second gate portion;
providing the second transistor with a third and a fourth diffusion region associated with a second gate, the second gate comprises a third gate portion and a fourth gate portion, the third gate portion and the fourth gate portion extending parallel to each other in the second direction, the gate length of the third gate portion being different from the gate length of the fourth gate portion;
forming a first and a second semiconductor surface region of the semiconductor substrate for forming the first and second transistor respectively; and creating the first gate on the first semiconductor surface region and the second gate on the second semiconductor surface region, wherein the first and second gate each have a non-uniform shape and the second gate is oriented with respect to an orientation of the first gate such that an effect of an overlay error on a device parameter of the second transistor has an opposite sign in comparison to an effect of the overlay error on a corresponding device parameter of the first transistor.

8. A method for measuring an overlay error of a lithographic pattern on a semiconductor substrate, the lithographic pattern comprising a semiconductor device which comprises a first transistor and a second transistor; the first transistor comprising a first and a second diffusion region associated with a first gate, the first gate comprising a first gate portion and a second gate portion, the first gate portion and the second gate portion extending parallel to each other in a first direction, a gate length of the first gate portion being different from a gate length of the second gate portion; the second transistor comprising a third and a fourth diffusion region associated with a second gate, the second gate comprising a third gate portion and a fourth gate portion, the third gate portion and the fourth gate portion extending parallel to each other in the first direction, a gate length of the third gate portion is different from a gate length of the fourth gate portion; the second transistor arranged adjacent to the first transistor in a second direction perpendicular to the first direction; the first and second gate each having a non-uniform shape, and the second gate being oriented with respect to an orientation of the first gate such that an effect of an overlay error on a device parameter of the second transistor has an opposite sign in comparison to an effect of the overlay error on a corresponding device parameter of the first transistor, the method comprising:
determining a first value of a device parameter of the first transistor of the semiconductor device;
determining a second value of the device parameter of the second transistor of the semiconductor device, and
determining a device parameter difference between the first value of the device parameter of the first transistor and the second value of the device parameter of the second transistor.

9. A method for measuring an overlay error according to claim 8, the method further comprising:
determining from the device parameter difference of the device parameters an overlay error value.

10. A method for measuring an overlay error according to claim 9, wherein the lithographic pattern comprises a plurality of semiconductor devices, each of the semiconductor devices being arranged to have a designed overlay error in the non-uniform gates along a direction of a connecting gate line, the method further comprising:
determining the device parameter difference between the first value of the device parameter of the first transistor and the second value of the device parameter of the second transistor of each of the semiconductor devices in relation to the designed-in overlay error, wherein the determination of the overlay error value comprises a linear regression calculation of the device parameter difference as a function of the designed overlay error.

11. A lithographic apparatus, comprising:
an illumination system configured to condition a radiation beam;
a support configured to support a patterning device, the patterning device being configured to impart the radiation beam with a pattern in its cross-section to form a patterned radiation beam;
a substrate table configured to hold a substrate;
an interferometric device configured to determine a position of the substrate table;
a projection system configured to project the patterned radiation beam onto a target portion of the substrate;
an input port;
a processor;
a memory; and
an output port, wherein the processor is connected to the input port, to the memory, and to the output port, the processor is configured to electrically connect through the input port to a semiconductor device, the semiconductor device is configured to determine an overlay error on a semiconductor substrate comprising a first transistor and a second transistor, the first transistor comprising a first and a second diffusion region associated with a first gate, the first gate comprising a first gate portion and a second gate portion, the first gate portion and the second gate portion extending parallel to each other in a first direction, a gate length of the first gate portion being different from a gate length of the second gate portion; the second transistor comprising a third and a fourth diffusion region associated with a second gate, the second gate comprising a third gate portion and a fourth gate portion, the third gate portion and the fourth gate portion extending parallel to each other in the first direction, a gate length of the third gate portion is different from a gate length of the fourth gate portion; the second transistor arranged adjacent to the first transistor in a second direction perpendicular to the first direction; the first and second gate each having a non-uniform shape, and the second gate being oriented with respect to an orientation of the first gate such that an effect of an overlay error on a device parameter of the second transistor has an opposite sign in comparison to an effect of the overlay error on a corresponding device parameter of the first transistor, the processor being configured to:

receive a first signal comprising a first value of the device parameter of the first transistor of the semiconductor device;

receive a second signal comprising a second value of the device parameter of the second transistor of the semiconductor device;

determine a device parameter difference between the first value of the device parameter of the first transistor and the second value of the device parameter of the second transistor of the semiconductor device; and determine from the device parameter difference an overlay error value.

12. A lithographic apparatus according to claim 11, wherein the output port is connected to the support and/or the substrate table to provide a respective control signal to the support and/or the substrate table, and the processor is configured to provide an overlay error correction signal to the support, the substrate table and/or the interferometric device, the overlay error correction signal being based on the determined overlay error value.

13. A computer program configured to be loaded by a computer, the computer comprising a processor, a memory, an input port and an output port, the memory being connected to the processor, and the input port and the output port each being connected to the processor, the computer being part of a lithographic apparatus, the lithographic apparatus comprising an illumination system configured to condition a radiation beam; a support configured to support a patterning device, the patterning device being configured to impart the radiation beam with a pattern in its cross-section to form a patterned radiation beam; a substrate table configured to hold a substrate; an interferometric device configured to determine a position of the substrate table, and a projection system configured to project the patterned radiation beam onto a target portion of the substrate, the processor being configured to connect through the input port to a semiconductor device, the semiconductor device being configured to determine an overlay error on a semiconductor substrate and comprising a first transistor and a second transistor, the first transistor comprising a first and a second diffusion region associated with a first gate, the first gate comprising a first gate portion and a second gate portion, the first gate portion and the second gate portion extending parallel to each other in a first direction, a gate length of the first gate portion being different from a gate length of the second gate portion; the second transistor comprising a third and a fourth diffusion region associated with a second gate, the second gate comprising a third gate portion and a fourth gate portion, the third gate portion and the fourth gate portion extending parallel to each other in the first direction, a gate length of the third gate portion is different from a gate length of the fourth gate portion; the second transistor arranged adjacent to the first transistor in a second direction perpendicular to the first direction; the first and second gate each having a non-uniform shape, and the second gate being oriented with respect to an orientation of the first gate such that an effect of an overlay error on a device parameter of the second transistor has an opposite sign in comparison to an effect of the overlay error on a corresponding device parameter of the first transistor; the computer program product after being configured to cause the processor to receive a first signal comprising a first value of a device parameter of the first transistor of at least one semiconductor device;

receive a second signal comprising a second value of the device parameter of the second transistor of the at least one semiconductor device; and determine a device parameter difference between the first value of the device parameter of the first transistor and the second value of the device parameter of the second transistor of the at least one semiconductor device.

14. A computer program according to claim 13, wherein the computer program is configured further cause the processor to determine from the device parameter difference an overlay error value.

15. A device manufacturing method, comprising:

transferring a lithographic pattern from a patterning device onto a substrate;

measuring an overlay error of the lithographic pattern on semiconductor substrate, the lithographic pattern comprising a portion of a semiconductor device comprising a first transistor and a second transistor, the first transistor comprising a first and a second diffusion region associated with a first gate, the first gate comprising a first gate portion and a second gate portion, the first gate portion and the second gate portion extending parallel to each other in a first direction, a gate length of the first gate portion being different from a gate length of the second gate portion; the second transistor comprising a third and a fourth diffusion region associated with a second gate, the second gate comprising a third gate portion and a fourth gate portion, the third gate portion and the fourth gate portion extending parallel to each other in the first direction, a gate length of the third gate portion is different from a gate length of the fourth gate portion; the second transistor arranged adjacent to the first transistor in a second direction perpendicular to the first direction; the first and second gate each having a non-uniform shape, and the second gate being oriented with respect to an orientation of the first gate such that an effect of an overlay error on a device parameter of the second transistor has an opposite sign in comparison to an effect of an overlay error on a corresponding device parameter of the first transistor;

determining a device parameter of the first transistor of the semiconductor device;

determining a device parameter of the second transistor of the semiconductor device; and determining a device parameter difference between the first value of the device parameter of the first transistor and the second value of the device parameter of the second transistor of the at least one semiconductor device.

16. A microelectronic device comprising a semiconductor device for determining an overlay error on a semiconductor substrate comprising a first transistor and a second transistor, the first transistor comprising a first and a second diffusion region associated with a first gate, the first gate comprising a first gate portion and a second gate portion, the first gate portion and the second gate portion extending parallel to each other in a first direction, a gate length of the first gate portion being different from a gate length of the second gate portion; the second transistor comprising a third and a fourth diffusion region associated with a second gate, the second gate comprising a third gate portion and a fourth gate portion, the third gate portion and the fourth gate portion extending parallel to each other in the first direction, the gate length of the third gate portion being different from the gate length of the fourth gate portion; the second transistor arranged adjacent to the first transistor in a second direction perpendicular to the first direction, the first and second gate each having a non-uniform shape and the second gate being oriented with respect to an orientation of the first gate such that an effect of an overlay error on a device parameter of the second transistor has an opposite sign in comparison to an effect of the overlay error on a corresponding device parameter of the first transistor.

17. A microelectronic device according to claim 16, wherein the microelectronic device further comprises functional blocks for carrying out a function, the semiconductor device being configured to provide a correction value based on the overlay error, the correction value being used by the functional blocks for correction of the function.

18. A microelectronic device according to claim 16, wherein the semiconductor device is provided in an array with a plurality of additional semiconductor devices, each device having a designed overlay error.

* * * * *